(12) United States Patent
Williams et al.

(10) Patent No.: US 11,340,181 B2
(45) Date of Patent: May 24, 2022

(54) METHODS AND SYSTEMS FOR LOW TO ULTRA-LOW MAGNETIC FIELD NUCLEAR MAGNETIC RESONANCE FOR DETECTING CHEMICAL NERVE AGENTS

(71) Applicant: Triad National Security, LLC, Los Alamos, NM (US)

(72) Inventors: Robert F. Williams, Los Alamos, NM (US); Michelle A. Espy, Los Alamos, NM (US); Jacob Luther Yoder, Los Alamos, NM (US); Derrick C. Kaseman, Los Alamos, NM (US); Per Erik Magnelind, Los Alamos, NM (US); Algis V. Urbaitis, Los Alamos, NM (US); Michael Timothy Janicke, Los Alamos, NM (US); Ryszard Michalczyk, Los Alamos, NM (US); Jurgen G. Schmidt, Los Alamos, NM (US); Pulak Nath, Los Alamos, NM (US); Scarlett Widgeon Paisner, Los Alamos, NM (US)

(73) Assignee: Triad National Security, LLC, Los Alamos, NM (US)

( * ) Notice: Subject to any disclaimer, the term of this patent is extended or adjusted under 35 U.S.C. 154(b) by 0 days.

(21) Appl. No.: 16/806,954

(22) Filed: Mar. 2, 2020

(65) Prior Publication Data
US 2020/0378910 A1 Dec. 3, 2020

Related U.S. Application Data

(60) Provisional application No. 62/812,412, filed on Mar. 1, 2019.

(51) Int. Cl.
*G01N 24/08* (2006.01)
*G01R 33/383* (2006.01)
(Continued)

(52) U.S. Cl.
CPC ......... *G01N 24/081* (2013.01); *G01R 33/307* (2013.01); *G01R 33/383* (2013.01); *G01R 33/3815* (2013.01); *G01R 33/445* (2013.01)

(58) Field of Classification Search
CPC .. G01N 24/081; G01N 24/084; G01R 33/383; G01R 33/307; G01R 33/3815; G01R 33/445
See application file for complete search history.

(56) References Cited

U.S. PATENT DOCUMENTS

| | | | | |
|---|---|---|---|---|
| 4,166,972 A | * | 9/1979 | King | G01R 33/46 324/310 |
| 5,206,592 A | * | 4/1993 | Buess | G01R 33/441 324/307 |

(Continued)

OTHER PUBLICATIONS

Takeda, et al. "Elemental analysis by NMR" 2012; Journal of Magnetic Resonance; vol. 224; pp. 48-52.
(Continued)

*Primary Examiner* — G. M. A Hyder

(57) ABSTRACT

A nuclear magnetic resonance (NMR) system is configured to detect chemical threat material. The system comprises a magnet configured to generate a magnetic field of about 300 millitesla or less; and a probe configured to detect nuclear relaxation of at least two nuclei selected from the group consisting of $^1H$, $^{19}F$, $^{31}P$ and $^{14}N$, and detect the spin density of nuclei selected from the group consisting of $^1H$, $^{19}F$, $^{31}P$ and $^{14}N$, following excitation.

20 Claims, 19 Drawing Sheets

(51) Int. Cl.
      G01R 33/30    (2006.01)
      G01R 33/3815  (2006.01)
      G01R 33/44    (2006.01)

(56) References Cited

U.S. PATENT DOCUMENTS

| | | | | |
|---|---|---|---|---|
| 7,355,402 | B1* | 4/2008 | Taicher | G01R 33/44 |
| | | | | 324/300 |
| 8,390,286 | B2 | 3/2013 | Matlashov et al. | |
| 8,912,795 | B2 | 12/2014 | Broz et al. | |
| 9,411,031 | B2 | 8/2016 | Espy et al. | |
| 2005/0202570 | A1* | 9/2005 | Pusiol | G01R 33/441 |
| | | | | 436/173 |
| 2014/0225614 | A1* | 8/2014 | Prado | G01R 33/4616 |
| | | | | 324/309 |

OTHER PUBLICATIONS

Espy, et al. "Ultra-low-field MRI for the detection of liquid explosives" 2010; Superconductor Science and Technology; vol. 23; 8 pages.

Austin, et al. "MAGViz: A Bottled Liquids Scanner Using Ultra-Low Field NMR Relaxometry" in: Magnetic Resonance Detection of Explosives and Illicit Materials, Springer, 2014, pp. 99-110.

Brideson, et al. "Determining complicated winding patterns for shim coils using stream functions and the target-field method" Conc. Magn. Res., 14 (2002) 9-18.

Carr, et al. "Effects of Diffusion on Free Precession in Nuclear Magnetic Resonance Experiments" Phys. Rev., 94 (1954) 630-638.

Dogan, et al. "Development of Halbach magnet for portable NMR device" Journal of Physics: Conference Series (Online), 153 (2009) 8 pages.

Doty, et al. "A multinuclear double-tuned probe for applications with solids or liquids utilizing lumped tuning elements" Journal of Magnetic Resonance 43 (1981) 399-416.

Doty, et al. "Using a cross-coil to reduce RF heating by an order of magnitude in triple-resonance multinuclear MAS at high fields" J. Magn. Reson., 182 (2006) 239-253.

Espy, et al. "Progress on Detection of Liquid Explosives Using Ultra-Low Field MRI" ITAS, 21 (2011) 530-533.

Gor'kov, et al. "Low-E probe for 19F-1H NMR of dilute biological solids" J. Magn. Reson., 189 (2007) 182-189.

Grant, et al. "A Modified Alderman-Grant Coil makes possible an efficient cross-coil probe for high field solid-state NMR of lossy biological samples" J. Magn. Reson., 201 (2009) 87-92.

Hills, et al. "A low-field, low-cost Halbach magnet array for open-access NMR" J. Magn. Reson., 175 (2005) 336-339.

Hoult "Fast recovery, high sensitivity NMR probe and preamplifier for low frequencies" Rev. Sci. Instrum., 50 (1979) 193-200.

Hoult, et al. "The signal-to-noise ratio of the nuclear magnetic resonance experiment" Journal of Magnetic Resonance, 24 (1976) 71-85.

Jiang, et al. "An efficient double-tuned 13C/1H probe ciicuit for CP/MAS NMR and its importance in linewidths" Journal of Magnetic Resonance 71 (1987) 485-494.

Mcneill, et al. "A low-E magic angle spinning probe for biological solid state NMR at 750MHz" J. Magn. Reson., 197 (2009) 135-144.

Meiboom, et al. "Modified Spin-Echo Method for Measuring Nuclear Relaxation Times" Rev. Sci. Instrum., 29 (1958) 688-691.

Sato-Akaba, et al. "Development of the Earth's Field NMR Spectrometer for Liquid Screening" Appl. Magn. Reson., 43 (2012) 579-589.

Wu. et al. "A strip-shield improves the efficiency of a solenoid coil in probes for high-field solid-state NMR of lossy biological samples" J. Magn. Reson., 200 (2009) 74-80.

* cited by examiner

| Nucleus | Calibration Factor | Signal amplitude | Spin density | Elemental ratio |
|---|---|---|---|---|
| $^1$H | 1 | 10000 | 10000 | 14 |
| $^{19}$F | 1.15 | 650 | 747.5 | 1.0465 |
| $^{31}$P | 8 | 90 | 720 | 1.008 |

METHODS AND SYSTEMS FOR LOW TO ULTRA-LOW MAGNETIC FIELD NUCLEAR MAGNETIC RESONANCE FOR DETECTING CHEMICAL NERVE AGENTS

RELATED APPLICATIONS

This non-provisional application claims the benefit of priority in U.S. provisional application No. 62/812,412 filed Mar. 1, 2019, and titled "LOW TO ULTRA-LOW MAGNETIC FIELD NUCLEAR MAGNETIC RESONANCE INSTRUMENT FOR DETECTING CHEMICAL NERVE AGENTS," the entire content of which is incorporated herein by reference.

Moreover, this application is related to the concurrently filed U.S. Patent Applications titled "METHODS AND SYSTEMS FOR J-COUPLED NUCLEAR MAGNETIC RESONANCE", the entire content of which is incorporated herein by reference.

FEDERALLY SPONSORED RESEARCH OR DEVELOPMENT

The United States government has rights in this invention pursuant to Contract No. 89233218CNA000001 between the United States Department of Energy (DOE), the National Nuclear Security Administration (NNSA), and Triad National Security, LLC for the operation of Los Alamos National Laboratory.

TECHNICAL FIELD

The present disclosure relates generally to NMR and in particular to utilizing low to ultra-low magnetic field NMR for detecting chemical nerve agents

BACKGROUND

Various materials and compositions pose threats to human safety in mass-transit scenarios. Organophosphorous compositions, and more particularly chemical nerve agents, are of significant concern.

Chemical nerve agents may be lethal in significantly small amounts. For example, at least some chemical nerve agents limited to a 3-1-1 bottle, which is the standard for carry-on of a commercial flight, may be sufficient to kill many if not all passengers onboard the flight.

Presently, bottles containing liquids, gels, and solids that passengers intend to carry on to commercial flights, are screened using X-ray imaging. X-ray imaging, however, is incapable of distinguishing a chemical nerve agent from consumer items because chemical nerve agents generally lack the high atomic number constituents necessary for an X-ray signature.

Other primary screener technology at airports include metal detectors and sub-mm wave scanners. These, like X-ray imaging, are ineffective for detecting chemical nerve agents.

BRIEF DESCRIPTION OF DRAWINGS

The drawings are not necessarily to scale or exhaustive. Instead, emphasis is generally placed upon illustrating the principles of the embodiments described herein. The accompanying drawings, which are incorporated in this specification and constitute a part of it, illustrate several embodiments consistent with the disclosure. Together with the description, the drawings serve to explain the principles of the disclosure.

In the drawings:

FIG. 18 is a table 1800 demonstrating the use of the flowchart 1700 to determine elemental ratios for a test sample according to one embodiment.

DETAILED DESCRIPTION

Figure 1:
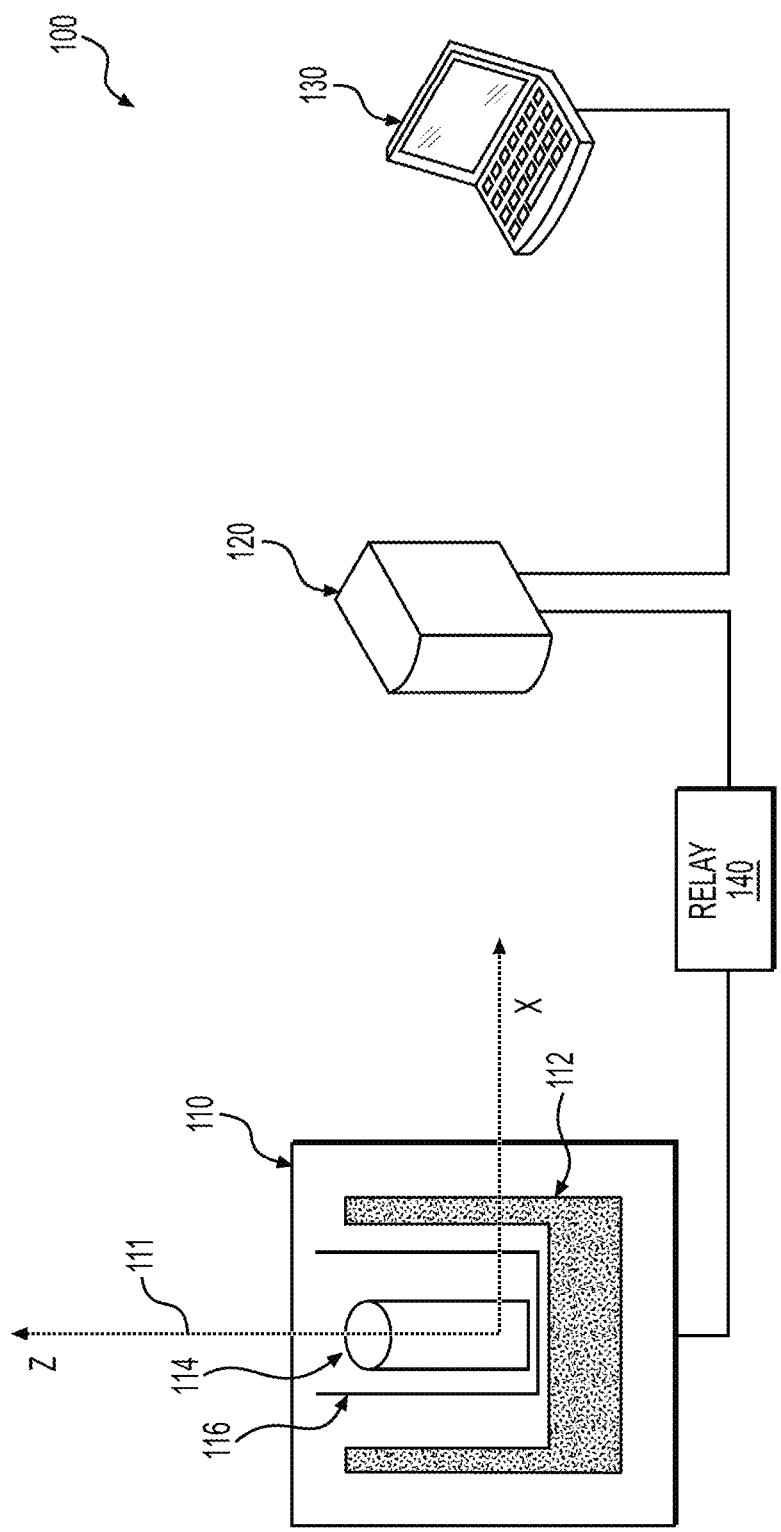
FIG. 1 is a diagram an NMR system 100 according to the some embodiments.

The following detailed description refers to the accompanying drawings. The same or similar reference numbers may be used in the drawings or in the description to refer to the same or similar parts. Also, similarly named elements may perform similar functions and may be similarly designed, unless specified otherwise. Details are set forth to provide an understanding of the exemplary embodiments. Embodiments, e.g., alternative embodiments, may be practiced without some of these details. In other instances, well known techniques, procedures, and components have not been described in detail to avoid obscuring the described embodiments.

While several exemplary embodiments and features are described here, modifications, adaptations, and other implementations may be possible, without departing from the spirit and scope of the embodiments. Accordingly, unless explicitly stated otherwise, the descriptions relate to one or more embodiments and should not be construed to limit the embodiments as a whole. This is true regardless of whether or not the disclosure states that a feature is related to "a," "the," "one," "one or more," "some," or "various" embodiments. Instead, the proper scope of the embodiments is defined by the appended claims. Further, stating that a feature may exist indicates that the feature may exist in one or more embodiments.

In this disclosure, the terms "include," "comprise," "contain," and "have," when used after a set or a system, mean an open inclusion and do not exclude addition of other, non-enumerated, members to the set or to the system. Further, unless stated otherwise or deducted otherwise from the context, the conjunction "or," if used, is not exclusive, but is instead inclusive to mean and/or. Moreover, if these terms are used, a subset of a set may include one or more than one, including all, members of the set.

Further, if used in this disclosure, a first variable is an increasing function of a second variable if the first variable does not decrease and instead generally increases when the second variable increases. On the other hand, a first variable is a decreasing function of a second variable if the first variable does not increase and instead generally decreases when the second variable increases. In some embodiment, a first variable is an increasing or a decreasing function of a second variable if, respectively, the first variable is directly or inversely proportional to the second variable.

Some embodiments provide techniques for detecting chemical compositions using low to ultra-low magnetic field nuclear magnetic resonance (NMR). In some embodiments, low to ultra-low magnetic field NMR refers to NMR using 300 millitesla or less.

NMR spectroscopy may be used to determine the content and purity of a sample, as well as the sample's molecular structure. Generally, atomic nuclei have nuclear spins and are electrically charged. NMR measures the net magnetic moment specific to certain elements from atomic nuclei.

In some embodiments, a sample is placed in a magnetic field (generally referred to as the polarization field) and the nuclear spins from the atoms in the sample align with the external field. Due to small differences between spin-up and spin-down quantum states, there is a net magnetic moment aligned with the magnetic field. Perturbing the net magnetic moment using radiofrequency pulses (generally referred to as the excitation field) results in detectable magnetization at specific frequencies according to the isotope. These frequencies are measured and used to determine the relative amount of each isotope based on signal intensity and the molecular structure based on differences in frequency.

In some embodiments, chemical compositions that may be detected using the teachings herein include chemical nerve agents, pesticides, and insecticides. Chemical nerve agents include organophosporous compounds that include P—F/P—H, P(=O), P—N, P—S, and/or P—C bonds, but having variable side chains and chemical moieties including but not limited to P—O—R, P—N—R, and P—S—R, where R may be a side chain such as an alkyl, aryl, vinyl, and related compositions.

In some embodiments, the NMR measurement requires four things: (1) a method for polarizing nuclear spins; (2) a homogeneous magnetic field that permits magnetic resonance precession to be observed; (3) passive analog electronics for exciting and detecting spin precession; and (4) electronics to power the probe during excitation and to record waveform during detection commonly referred to as the NMR console.

FIG. 1 is a diagram an NMR system 100 according to the some embodiments. NMR system 100 includes a housing 110, a console 120, a computing device 130, and a relay 140. Housing 110 contains a magnet 112, a probe 114, and a shim 116. Magnet 112 and probe 114 may be electrically coupled to console 120, which may communicate with computing device 130.

Housing 110 may be made of any suitable material that permits the safe performance of NMR spectroscopy measurements. In some embodiments, the material of housing 110 may be selected to provide as lightweight of an NMR system as possible. Example housing 110 materials include, but are not limited to, metals/alloys such as aluminum or stainless steel, plastics such as poloxymethylene or polycarbonate, and composites containing glass or carbon fibers.

Housing 110 may have various dimensions. Minimizing the housing 110's dimensions may be limited simply by the sizes and configuration of the magnet 112 and the probe 114. In some embodiments, housing 110 may be configured as small as possible, provided the magnet 112 and the probe 114 can be adequately positioned within the housing 110.

Magnet 112, may be a permanent magnet, an electromagnet, or a superconducting magnet. In FIG. 1, the hypothetical axis-pair 111 illustrates the directions of the magnetic field (the x direction) and the symmetry axis of magnet 112 (the z direction) according to the embodiment shown in FIG. 1.

In some embodiments, magnet 112 is a permanent magnet that provides a relatively homogeneous magnetic field perpendicular to the axis of probe 114. One example of such a magnet is the Halbach array magnet.

In some embodiments, magnet 112 is a 150 mm bore 0-1 tesla variable magnetic field superconducting magnet. Such a magnet enables the optimization of hardware and protocols at different magnetic field strengths without needing to purchase and use multiple magnets. While such a magnet is beneficial in certain instances, such a magnet is relatively expensive, heavy, and costly to operate. Thus, in some other embodiments, it may be beneficial to use a less expensive, more compact, and lighter permanent magnet.

Magnet 112 may generate a magnetic field corresponding to a low or ultra-low magnetic field. For example, magnet 112 may generate a magnetic field of about 300 millitesla or less. In at least some examples, the magnet 112 may generate a magnetic field of about 100 millitesla or less.

Shim 116 may be used to improve the homogeneity of magnet 112. The shim may be composed of electromagnets, ferromagnetic materials, or permanent magnets. Electromagnets and permanent magnets increase the homogeneity of the magnet by creating new magnetic fields. Ferromagnetic materials, on the other hands, attract field lines and improve the homogeneity of the magnet by reshaping the field generated by the magnet.

Figure 2:
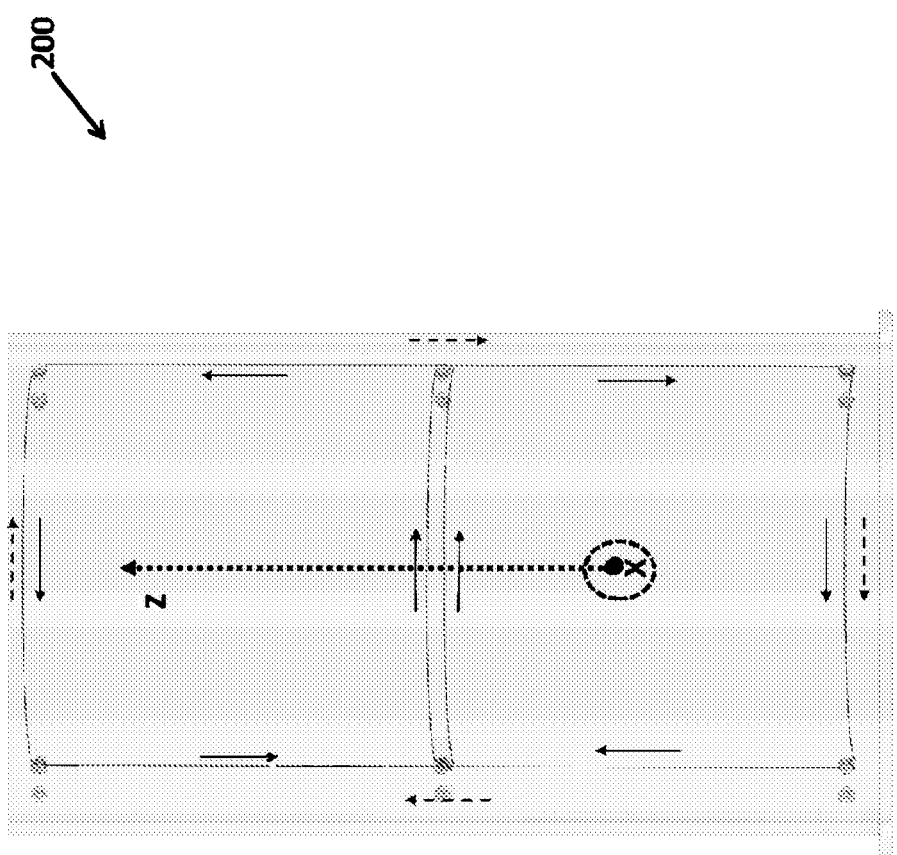
FIG. 2 is a cross section of a shim 200 according to an embodiment.

A shim composed of electromagnets may have two distinct coils producing field gradients along the directions of the magnetic field and the magnet symmetry axis, as depicted in FIG. 2.

Console 120 may power the probe and record measurements detected by the probe. In Some embodiments, the console may operate the probe to detect nuclei commonly found in chemical nerve agents.

In some embodiments, the console may operate the probe (and the magnet when the magnet is an electromagnet) to perform individual 10 second measurements to detect H-1, F-19, P-31 nuclei. Measurement time may vary and may depend on magnetic field, sample size, and/or instrument configuration. In other embodiments, the console may operate the probe (and the magnet when the magnet is an electromagnet) to perform a single 10 second measurement to detect H-1, F-19, and P-31 nuclei. In such embodiments, the NMR system of FIG. 1 may be classified as high-throughput screening.

The console may convert output received from the probe into a digital representation that may be interpreted by a user of the computing device. In an embodiment, the computing device may implement logic that enables the computing device to process digital outputs of the console for purposes of determining whether detected samples are chemical nerve agents, chemical threats, or other chemical compounds that may or may not be harmful to humans. An example of such logic is illustrated below.

In addition to or instead of displaying a digital output of the console to a user, the computing device may output an indicator determined based on the computing device's application of the logic to a sample. The computing device may output various indicators, including but not limited to "benign," "potential threat," and "threat." For example, a "potential threat" indicator may correspond to significantly large phosphorous or fluorine NMR spectra. For further example, a "threat" indicator may correspond to phosphorous and fluorine NMR spectra including J-coupling represented by an about 1 kHz splitting of peaks. The computing device may output an indicator as audio, may display an indicator on a screen, may output the indicator as a tactile output, etc.

Computing device 130 may be a tablet, desktop computer, smart phone, or some other type of computing device.

Relay 140 may be a high frequency relay. Various commercial frequency relays may be used. For example, a frequency relay manufactured by Teledyne Relays, USA, may be used. The frequency relay may switch between different passive electronics or probe coils to optimize probe sensitivity for different nuclei.

Moreover, components of the NMR system (e.g., the probe, the console, and the computing device) may communicate using various communication techniques. In various embodiments, the components may communicate using a wired connections, or one or more wireless connections. Such wireless connections include, but are not limited to, using cellular transmission, satellite transmissions, radio transmissions (e.g., Bluetooth), and/or wireless local area network (WLAN) transmissions.

FIG. 2 is a cross section of a shim 200 according to an embodiment. Shim 200 may be designed for a magnet for which a homogeneous magnetic field is desired in the x direction (pointing out of the page) and the symmetry axis is in the z direction (vertical). The magnet may be a Halbach magnet. Shim 200 is in the shape of a vertical cylinder. FIG. 2 shows the front half of shim 200 in a vertical cross section. Two different shim coils are wound on winding pegs: an x shim coil and a z shim coil. For the x shim coil the current path is represented by dashed arrows, and it produces a homogeneous dBx/dx gradient. For the z shim coil, on the other hand, the current paths are represented by the solid arrows and it produces a homogeneous dBx/dz gradient. The back side of the shim coils and the respective current paths are the mirror image of the front side.

Figure 3:
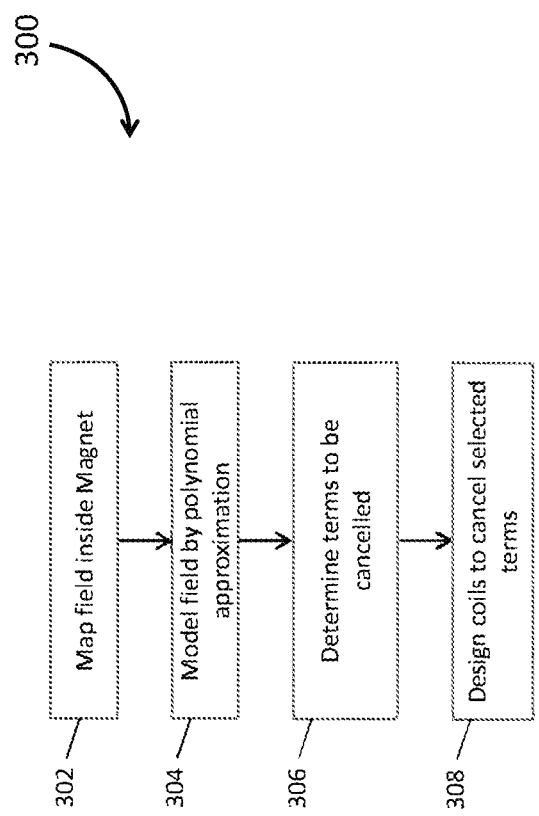
FIG. 3 is a flowchart for designing the shim according to some embodiments.

FIG. 3 is a flowchart for designing the shim according to some embodiments.

In a step 302, the field inside magnet is mapped.

In step 304, the field is modeled by a polynomial approximation. The polynomial approximation may be an expression for field in terms of spatial coordinates, with the coefficients determined by non-linear regression. Generally terms may be added, starting from lower order to higher, until the polynomial approximation is sufficiently close to the field map data In step 306, it is determined which terms in the expansion should be canceled to achieve desired homogeneity. The determination may start with lowest order terms.

In step 308, based on the results of the determination, shim coils are designed to produce gradients of the desired order, e.g., a first order gradient in the x direction cancels the x term in the expansion, etc.

In one embodiment, the field is modeled as shown in equation (1)

$$B(x,y,z)=B0+B\_x*x+B\_y*y+B\_z*z+B\_xx*x^2+ \ldots \quad (1)$$

In equation (1), z is directed along the bore, while x is the direction of the magnet field. For this particular magnet, shim coils that cancel the B_x*x and B_z*z terms improve the field uniformity sufficiently to resolve the phosphorous-fluorine doublet that is characteristic of G-agents.

First order gradient coils are constructed by designing and printing a former with winding pegs that resides outside of the probe and inside the magnet bore. 5 turns of 32 AWG magnet wire for each coil may create an optimal shim field, requiring roughly 1 W of power to run.

Next, turning to the probe, it may excite nuclear spins and detect the relaxation of nuclei back to their base state. Generally, the probe may be located at the center of the magnetic field generated by the magnet.

The probe may include radio frequency coils. The radio frequency coils may be configured at specific frequencies for specific nuclei to be detected.

The probe may include one or more detection coils. In a two detection coil implementation, the probe may include an inner coil (e.g., the coil closest to the sample) and an outer coil (e.g., the coil further from the sample than the inner coil). A two detection coil implementation enables the probe to excite multiple nuclei. In an embodiment, the inner coil may be configured to detect, for example, H-1, F-19, P-31, and/or other nuclei. By changing the electronic circuit, for example by using relays to select different tuning elements, the probe can be selective for different nuclei.

Figure 4:
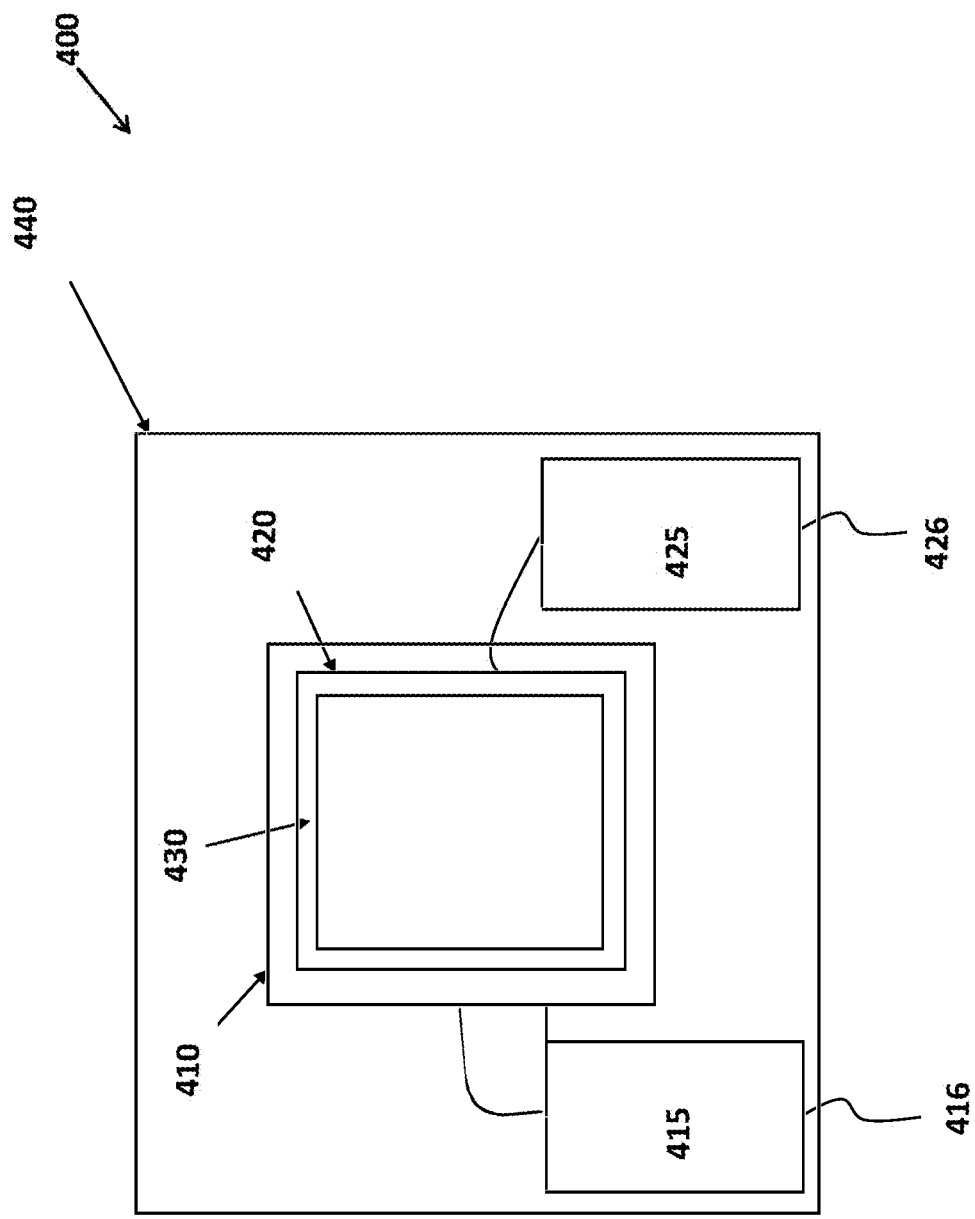
FIG. 4 is a diagram of a probe 400 according to some embodiments.

FIG. 4 is a diagram of a probe 400 according to some embodiments. Probe 400 includes a first coil 410 (aka the first detection coil), a first tuning circuit 415, a second coil 420 (aka the second detection coil), a second tuning circuit 425, a shield, and a probe frame 440. The first coil and the first tuning circuit may be utilized to excite and detect one or more nuclei of a first set of nuclei within a first range of frequencies. In some embodiments, the first set of nuclei includes the nuclei of hydrogen and fluoride. In some embodiments, the first coil in the first tuning circuit can detect both hydrogen and fluorine with no need for retuning.

The second coil and the second tuning circuit, on the other hand, may be utilized to excite and detect one or more nuclei of a second set of nuclei within a second range of frequencies. In some embodiments, the second set of nuclei include phosphorus and nitrogen.

The probe frame may provide a platform for holding, or a housing for containing, one or more of the first coil, the first tuning circuit, the second coil, and the second tuning circuit. The first and second tuning circuits may connect to the relay via wires 416 and 426, respectively.

Figure 5:
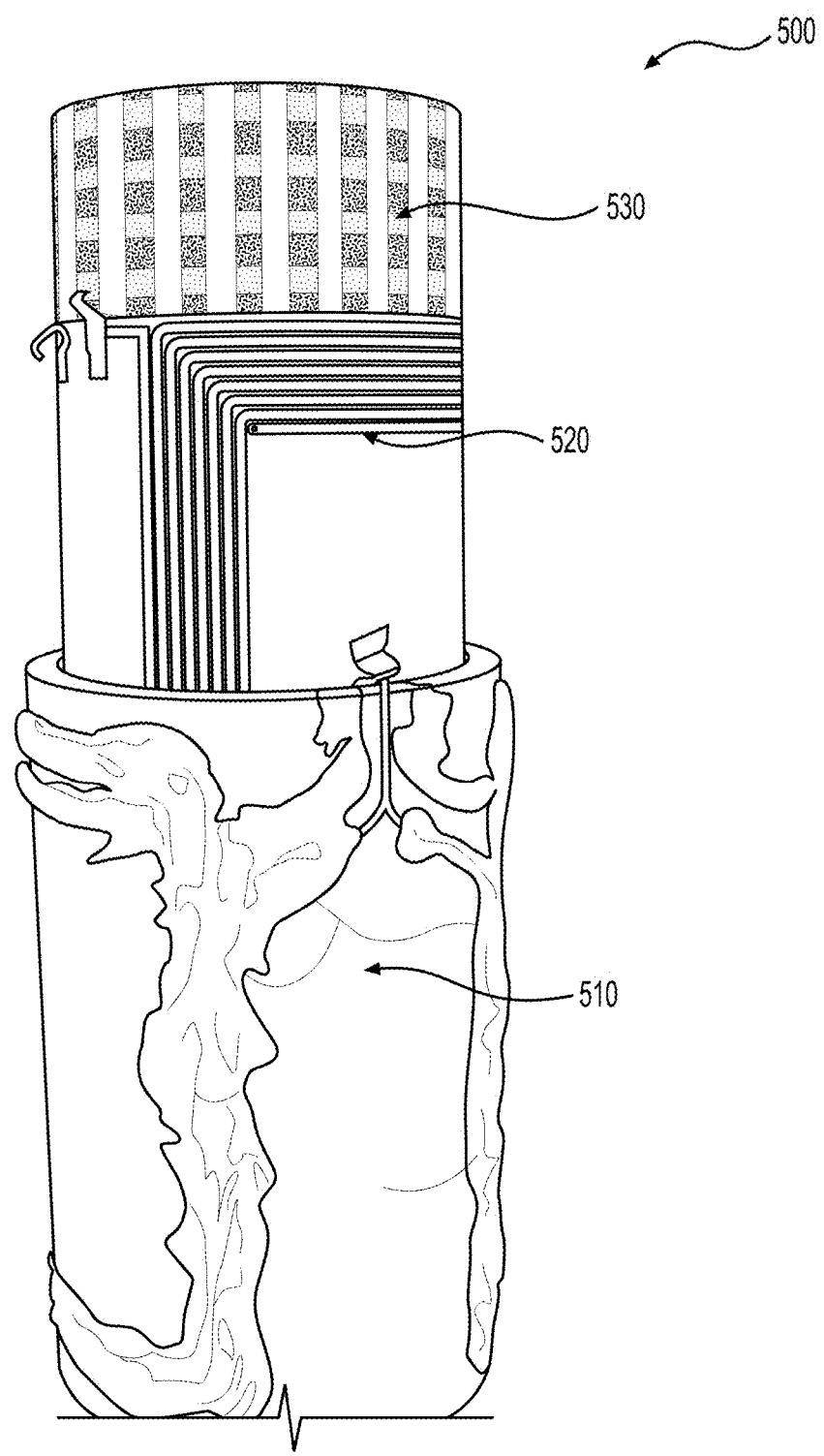
FIG. 5 is a photo of an assembly of a coil package of the probe according to some embodiments.

FIG. 5 is a photo of an assembly of a coil package of the probe according to some embodiments. In this embodiment, coil package 500 is cylindrical and includes three coaxial cylinders; respectively from out to in, a first coil 510, a second coil 520, and a shield 530.

In some embodiments, the first coil is a modified Alderman-Grant coil (MAGC). In some other embodiments, the first coil is a parallel saddle coil. Further, in some embodiments the second coil is a series saddle coil. In other embodiments the second coil is a solenoid.

Figure 6A:
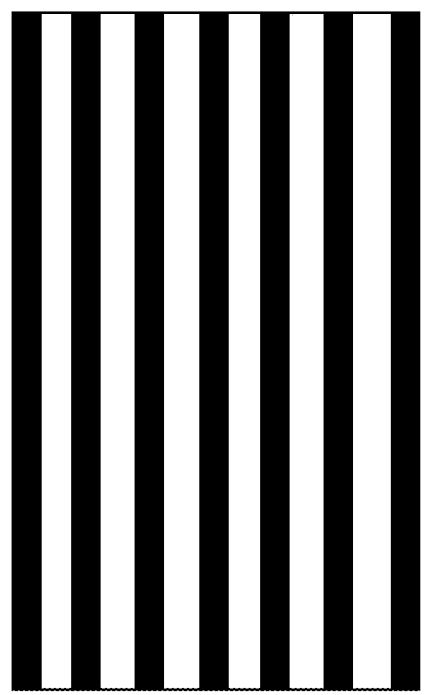
FIG. 6A shows a front view 610 and a back view 620 of shield inset 600 as built in flat form.
Figure 6A:
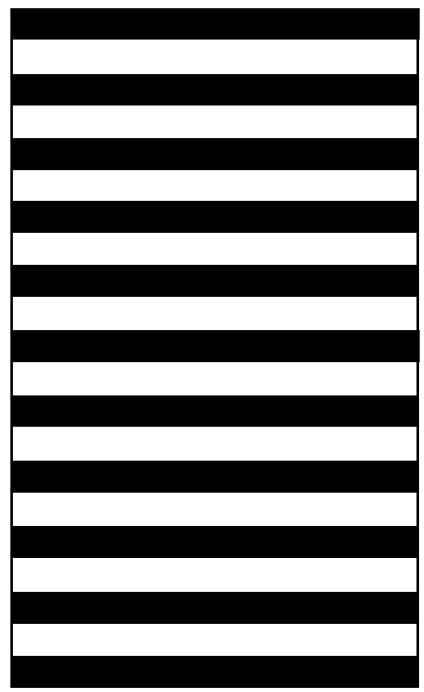
Figure 6B:
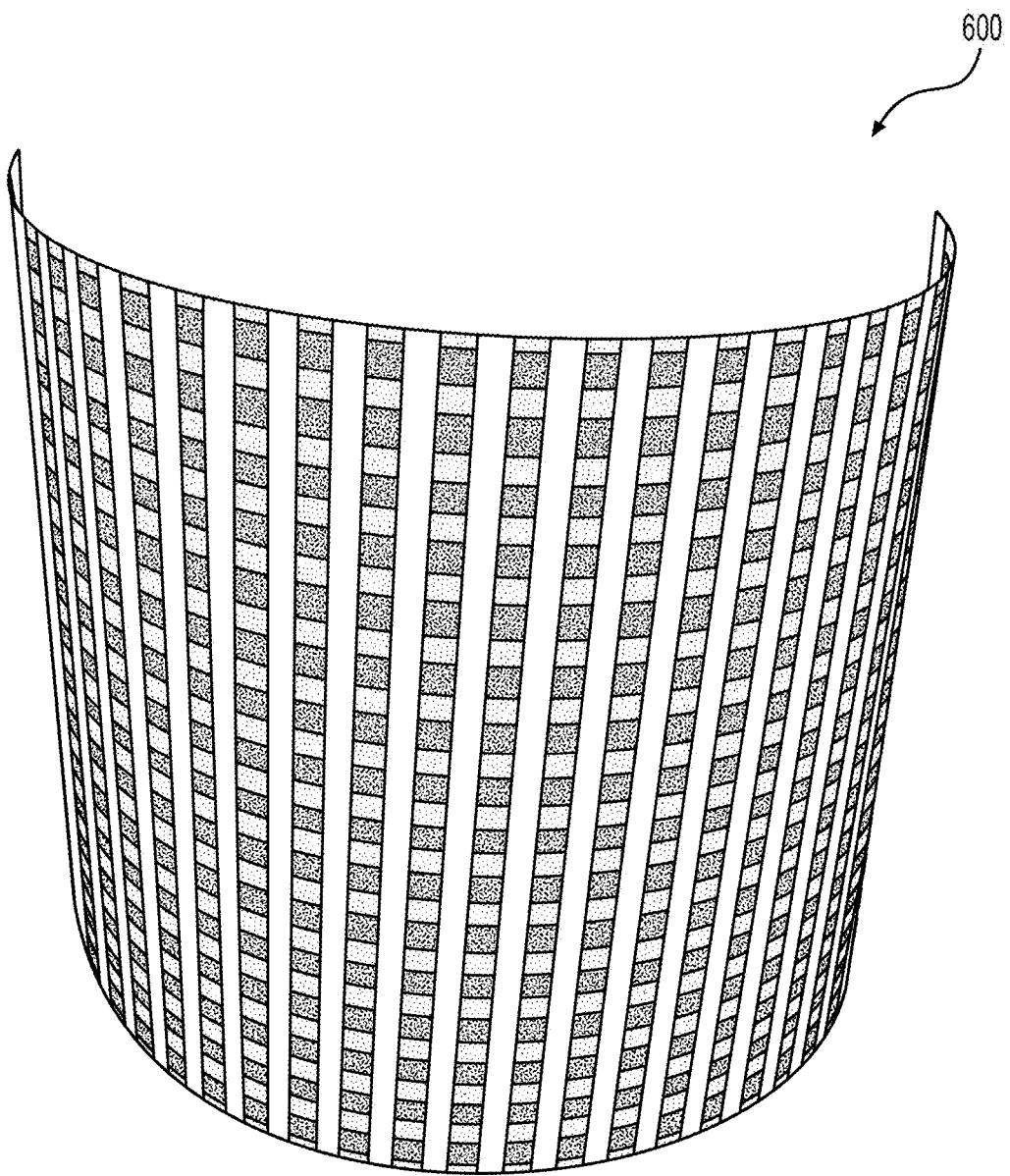
FIG. 6B shows a 3D view of shield inset 600 as shaped into a cylinder and inserted in the coil package, according to some embodiments.

The shield may shield the space inside the coil package from all or part of the electric fields generated by the first and second coils. The shield may be built as a flat shield insert and then shaped properly and inserted into the assembly of the coil package. FIGS. 6A and 6B show such a shield insert 600 according to an embodiment.

In particular, FIG. 6A shows a front view 610 and a back view 620 of shield inset 600 as built in flat form, and FIG. 6B shows a 3D view of shield inset 600 as shaped into a cylinder and inserted in the coil package.

Double strip shield 600 is composed of two layers of copper strips, the front layer and the back layer. The front layer of strips run from top to bottom and are shown as vertical dark strips in front view 610. The back layer of strips, on the other hand, run from left to right and are shown as horizontal dark strips in back view 620. The double strip shield may be manufactured with a flexible printed circuit board process on a kapton substrate. The substrate appears as bright strips between the copper strips in FIGS. 6A and 6B. In one embodiment, the copper strips are approximately 3/16" wide with 3/16" gaps in between them. When implemented in the coil package, the shield is bent into a cylinder shape, as shown in FIG. 6B, and is the innermost component of the probe. The vertical strips provide shielding from vertical electrical fields created by the probe coils while the horizontal strips provide shielding from the horizontal electrical fields created by the probe coils. Because the strips are all electrically isolated from one another, alternating magnetic fields may penetrate the double strip shield with minimal shielding.

Some embodiments eliminate or reduce the need for retuning by using low electric field coils or the shield.

Retuning may be needed due to electrical coupling between the sample and the probe. Such coupling may add stray capacitance to the NMR detection circuits, as well as potential dielectric and resistive losses. The variation in shape and composition of samples may normally cause tuning shifts between sample changes and necessitate adjustment of the tuning capacitors of the detection circuits. Some embodiments reduce the electric field by using intrinsically low electric field design for the detection coils (for example, using parallel saddle coil as the first coil for detection of hydrogen and fluorine). Alternatively, or in addition, some embodiments use the shield to reduce electric fields generated by one or both of the coils (for example, series saddle coil used as the second coil for detection of lower frequency nuclei, such as phosphorus). These techniques reduce or eliminate the coupling effects and the need for retuning between sample changes.

Figure 7:
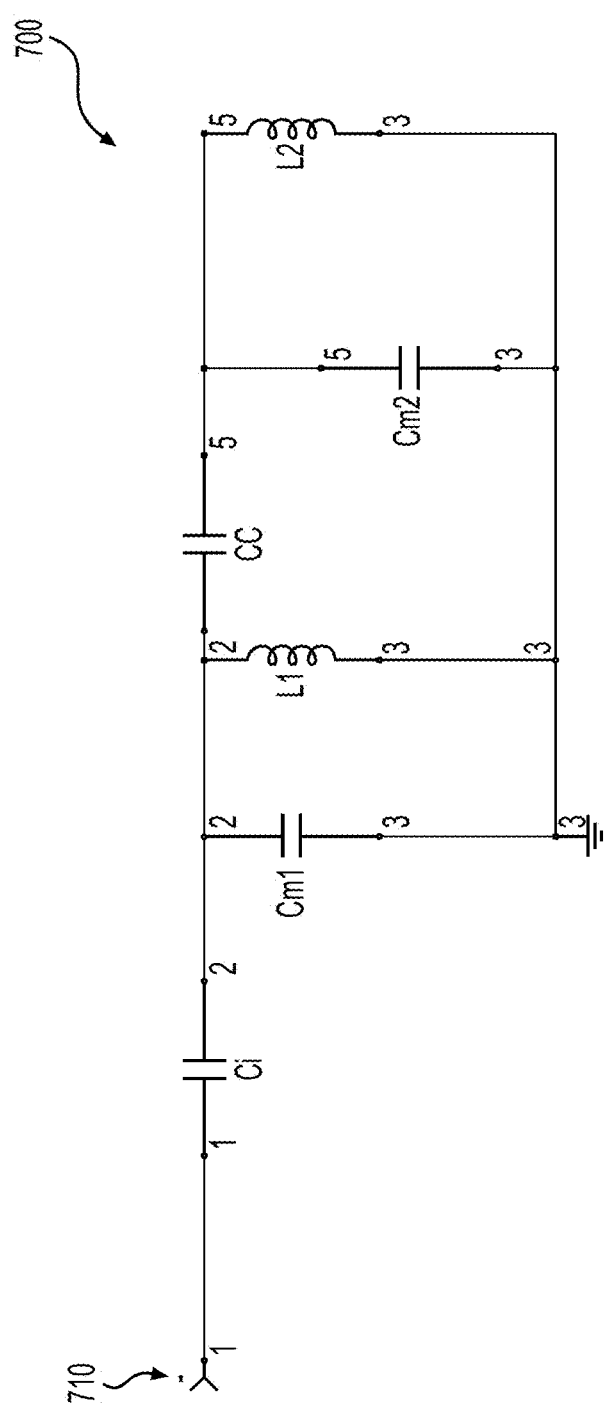
FIG. 7 is a circuit diagram of a first tuning circuit 700 according to an embodiment.

FIG. 7 is a circuit diagram of a first tuning circuit 700 according to an embodiment. First tuning circuit 700 includes a first port 710; four capacitors Ci, Cm1, Cm2, and Cc; and two inductors L1 and L2, arranged in the configuration shown in FIG. 7.

Inductor L1 is the first coil and inductor L2 is an external inductor of approximately the same inductance as L1. Capacitors Ci, Cc, Cm1, and Cm2 are chosen to cause the first tuning circuit to resonate at the frequencies of the one or more nuclei of the first set.

In some embodiments, the first tuning circuit simultaneously resonates at the hydrogen and fluorine NMR frequencies. In one such embodiment, Cm1, Cm2, and Ci are 6-60 pF variable capacitors, while Cc is a 1-20 pF variable capacitor and L2 is a fixed 1 µH inductor.

Figure 8:
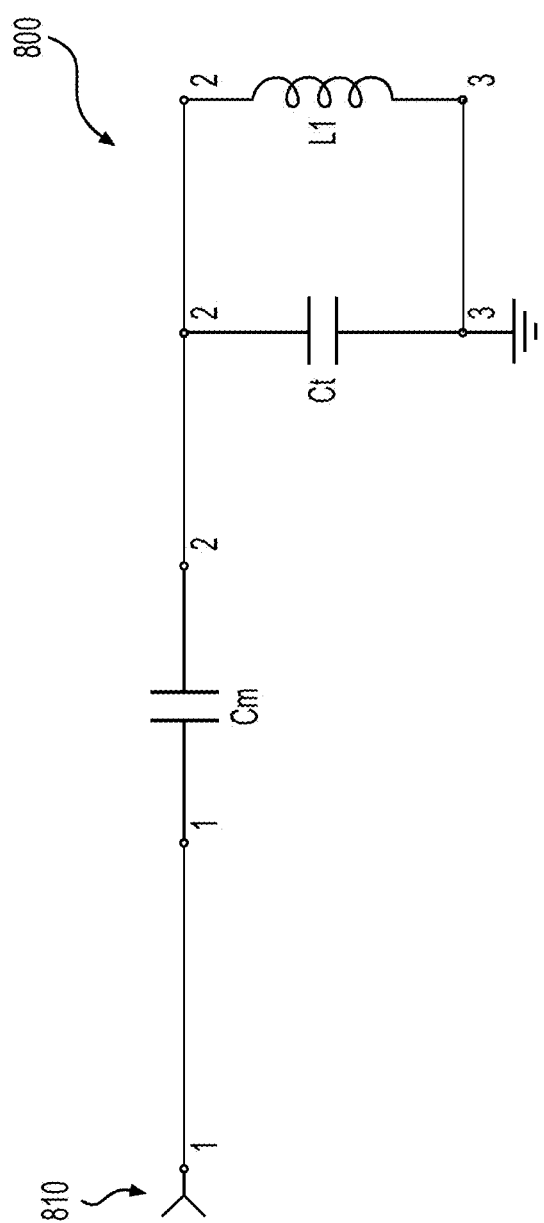
FIG. 8 is a circuit diagram of a second tuning circuit 800 according to an embodiment.

FIG. 8 is a circuit diagram of a second tuning circuit 800 according to an embodiment. Second tuning circuit 800 includes a second port 810, two capacitors Cm and Ct, and the inductor L1, arranged in the configuration shown in FIG. 8.

Inductor L1 is the second coil. Capacitors Cm and Ct are chosen to cause the second tuning circuit to resonate at the frequencies of the one or more nuclei of the second set.

In some embodiments, the second tuning circuit resonates at the phosphorous NMR frequency. In one such embodiment, L1 has an inductance of approximately 16 µH, Cm is a variable capacitor with 6-60 pF range tuned to approximately 25 pF, and Ct is a variable capacitor with 6-60 pF range tuned to approximately 35 pF.

Some embodiments use the following method to tune the system to get the right resonance frequencies. First, the inductance of each detection coil is estimated roughly using approximate inductance formulas, which depend on loop area, number of turns, and whether the type of the coil (e. g., Parallel saddle coil or series saddle coil). Then, these inductance values are fed into a simulation package (for example, Keysight Genesys), along with the circuit schematic. The output would be the capacitor values that achieve correct tuning, i.e. tuned to the necessary NMR frequencies. These values are used to select appropriate variable capacitors for the capacitors, such as Cm, Ct, Cm1, Cm2, Cc, and Ci in the previous embodiments. Finally, circuit tuning is achieved by observing the S11 parameter for each port on a network analyzer, and adjusting the variable.

Figure 9:
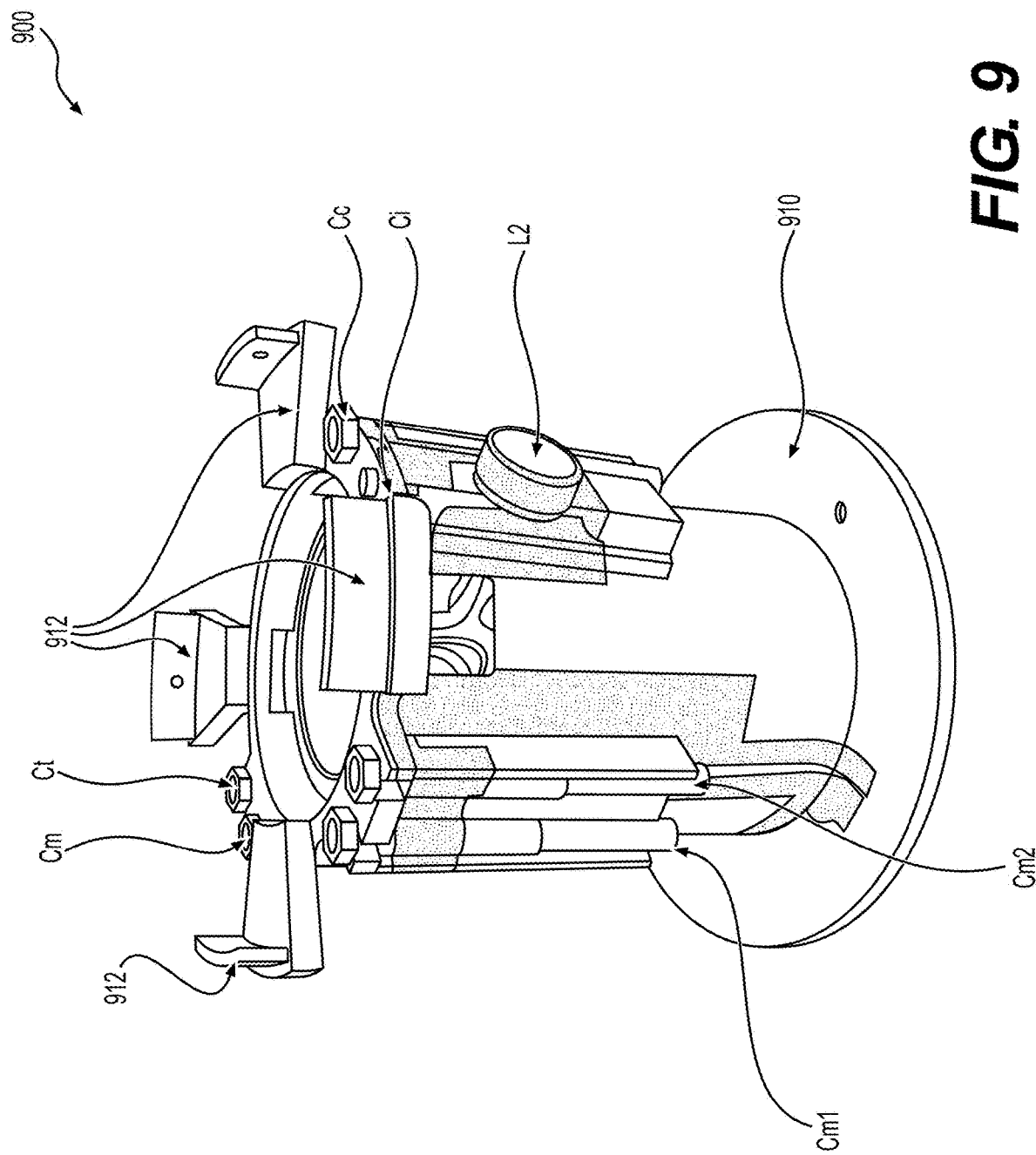
FIG. 9 is a photo of a probe 900 according to an embodiment.
Figure 10:
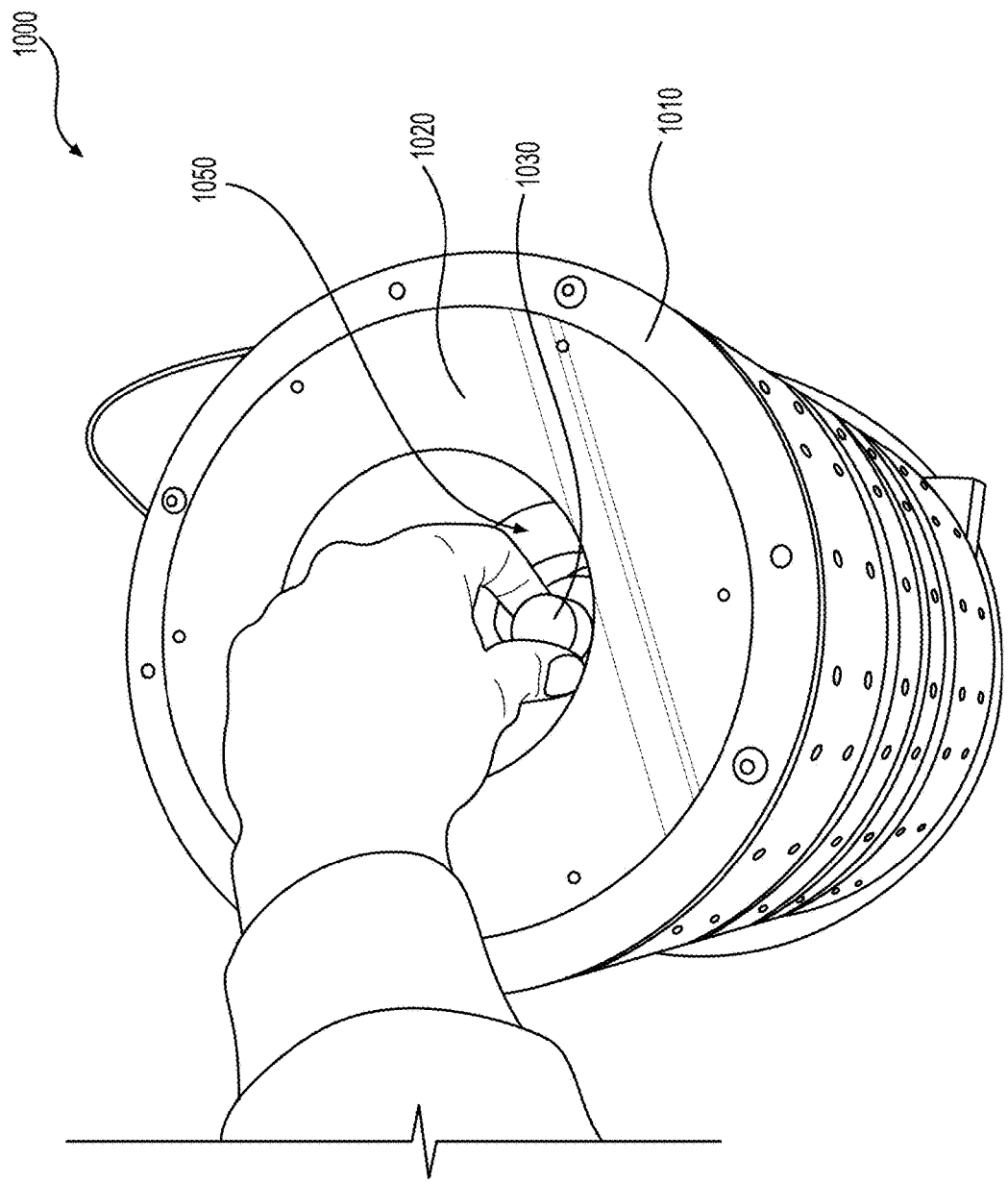
FIG. 10 is a photo of an NMR housing 1000 according to an embodiment.

FIG. 9 is a photo of a probe 900 according to an embodiment. In particular, FIG. 9 shows a probe frame 910, and attached to the frame six capacitors Cm, Cm1, Cm2, Cc, Ci, and Ct; and one inductor L2. Probe frame 910 includes four mounting flanges 912 that enables probe 900 to be attached to the housing of the NMR system. The probe frame in this embodiment is 3D printed with impact modified PLA plastic. Electrical connections between the capacitors, inductors, coils and ports are made with 0.002" thick, 0.250" wide electrical tape, soldered to components to make electrical contact FIG. 10 is a photo of an NMR housing 1000 according to an embodiment. NMR housing 1000 includes an outer layer 1010 and a hanger 1020, and further contains a probe 1050 that is minimally seen in the photo. Outer layer 1010 is made of Alloy 6061 Aluminum. Hanger 1020 is made of 3D printed ABS plastic and supports probe 1050, which attaches to the hanger by its brackets. The photo further shows a sample bottle 1030 that is being placed inside probe 1050.

In one embodiment, the magnet is a Halbach magnet with an outer diameter of 10.00", inner diameter (i.e. bore) of 5.43", and a height of 9.25". Moreover, the detection coil set (combination of the first coil and the second coil) has an inner diameter of 2.05", an outer diameter of 2.5", and a height of 4.25". The probe tuning circuits reside outside the detection coil set, and are mounted on a frame approximately 5.5" tall and 5.25" in diameter.

Some embodiments can accommodate samples that are up to 10 times larger (e.g., up to 2" diameter) than previously common samples and thus allow bottles to be placed directly into the probe without sample preparation, provided that the bottle measures 2.0" diameter or less. Therefore, some embodiments can achieve a previously not achieved large bottle size relative to the size of the magnet, and at the same time be capable of detecting phosphorus, in addition to hydrogen and fluorine.

In some embodiments, the probe may be designed to receive sample holders of various sizes, dimensions, and opacities. It may be beneficial for the sample holders to be non-ferromagnetic. In an embodiment in which the NMR system is configured to detect chemical nerve agents, the probe may be configured to receive sample containers having dimensions permitted to be carried onto mass-transport vehicles, such as airplanes. For example, the probe may be configured to receive sample containers conforming to Transportation Security Administration guidelines. Such sample containers may be dimensioned to contain about 3.4 ounces (or about 100 mL) of liquid. Examples of such containers may have widths of about 3.2 cm to about 5.4 cm. Sample containers that may be positioned within the probe include, but are not limited to, sample containers made of glass or plastic. The probe may be configured, and positioned within the housing, in a manner that permits a human operator to manually place a sample container, containing a sample, within the probe, or an automated sampling system can be used to position samples in the probe and the magnet.

Figure 11:
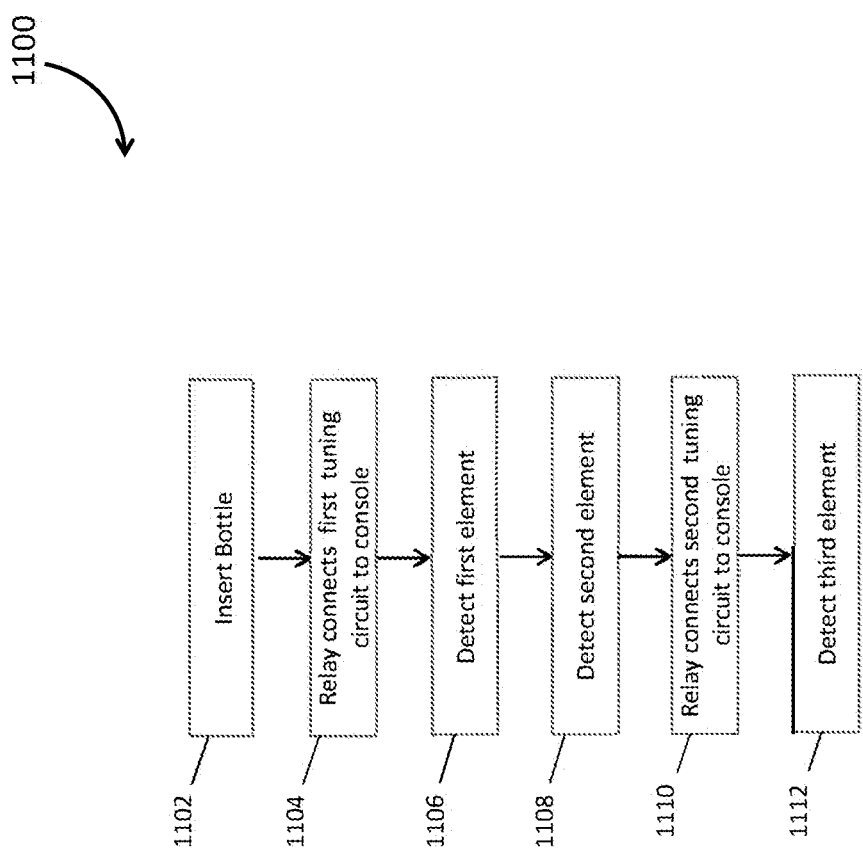
FIG. 11 is a flowchart for the operation sequence of the NMR detection system of some embodiments

FIG. 11 is a flowchart for the operation sequence of the NMR detection system of some embodiments In step 1102, a sample container is inserted and the measurement sequence is started.

In step 1104, the relay connects the first tuning circuit to the console.

In a step 1106, the NMR signal is detected for a first nucleus, for example that of H-1.

In a step 1108, the NMR signal is detected for a second nucleus, for example that of F-19.

In step 1110, the relay connects the second tuning circuit to the console.

In step 1112, an NMR signal is detected for a third nucleus, for example, that of P-31.

For the detections, some embodiments use a Can-Purcell Meiboom-Gill sequence.

In some embodiments, in which the detected nuclei are H-1, F-19, and P-31, respectively, the above of measurements is beneficial because hydrogen and fluorine often reach equilibrium magnetization in the magnet faster than phosphorous. The chosen order of measurements may result in a measurement of hydrogen NMR roughly 2 s after the sample container is placed in the magnet, fluorine NMR signals 4 s after insertion in the magnet, and phosphorous NMR signals about 6 s after insertion in the magnet. Using a relay to select the active port connected to a single port NMR console may also be much cheaper than using a multi-port NMR console for simultaneous acquisition of NMR signals, which may nearly double the cost of the NMR electronics.

Figure 12:
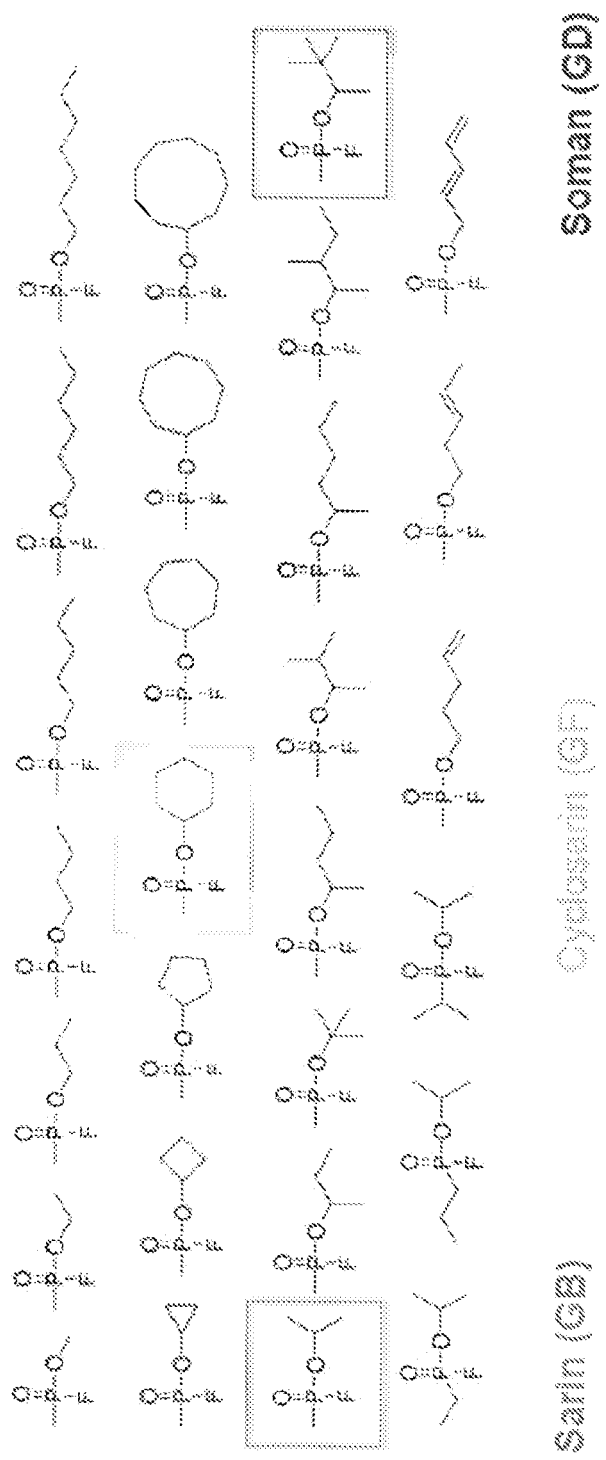
FIG. 12 depicts variability of the structure of chemical warfare agents (CWAs) as detected by some embodiments.

FIG. 12 depicts variability of the structure of chemical warfare agents (CWAs) as detected by some embodiments. In particular, FIG. 3 shows 28 different chemical structures for various CWA's, arranged in four rows. Of these agents, three known agents are identified (placed in boxes): Cyclosarin (GF) in the second row; and Sarin (GB) and Soman (GD) in the third row. Various G-nerve agents may include the P—F bond. They may also include a cyanide group (CN), or S-containing organic group (V-agents). In each row, from left to right, the organic group bound to the oxygen atom grows larger. This organic group may be a linear chain (row 1), a cyclic structure (row 2), branched (row 3), or contain multiple bonds (row 4, columns 3-6). Additionally, the organic group directly bound to the phosphorus atom may also change as illustrated as row 4.

Figure 13:
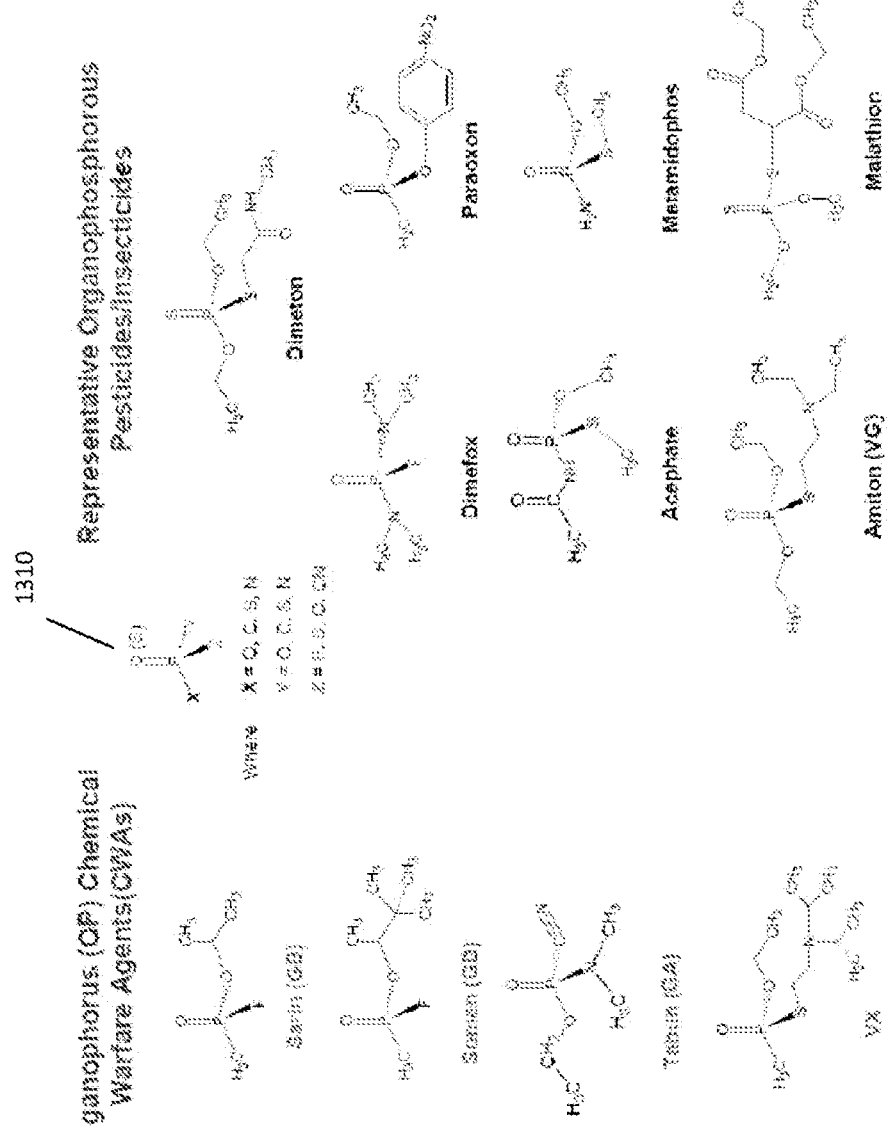
FIG. 13 also depicts the variability of CWA's and their relation to some other chemicals.

FIG. 13 also depicts the variability of CWA's and their relation to some other chemicals. In particular, chemical structure 1310 shows the general structure of CWA's according to some embodiments. Structure 1310 shows the variability of the number of CWAs. Left column shows four CWAs. The right columns show some pesticides and insecticides, which have structures that are similar to CWAs in some aspects.

Figure 14:
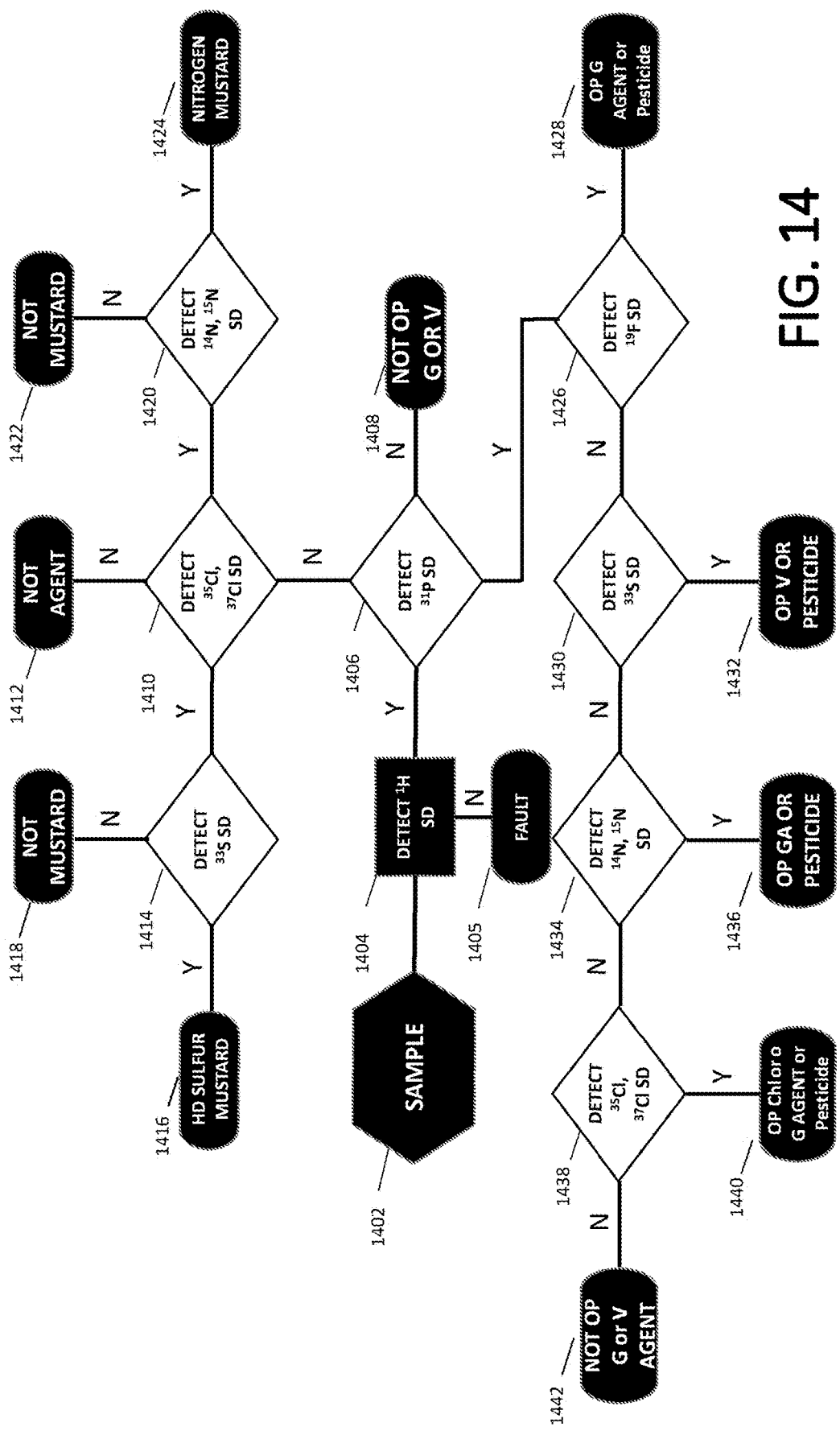
FIG. 14 is a flowchart for analyzing a sample using NMR detection systems of some embodiments.

FIG. 14 is a flowchart for analyzing a sample using NMR detection systems of some embodiments.

In step 1402, the system acquires a sample.

In step 1404, the system detects H-1 spin density (SD).

If H-1 is not detected (step 1404: No), the system decides a fault has occurred, either the sample bottle is empty, or it has been manipulated to defeat the scanner, or else there is a problem with the NMR detection system.

If H-1 is detected (step 1404: Yes), then in step 1406, the system runs the detection of P-31 SD.

If p31 is detected (step 1406: Yes), then in step 1426, the system runs the detection of F-19SD.

If F-19 SD is detected (step 1426: yes) the system decides in step 1428 that the substance is an organophosphorus agent or a pesticide.

If the result of step 1426 is no, the system decides in step 1408 that the substance is not a G or V agent.

Moreover, if the result of step 1426 is no, the system then runs the detection of S-33 SD in step 1430.

If the result of step 1430 is yes, the system decides in step 1432 that the substance is an organophosphorus V agent.

If the result of step 1430 is no, in step 1434 the system detects either N-14 or N-15 SD, or both.

If the result of step 1434 is yes, in step 1436 the system decides that the substance is an organophosphorus GA agent.

If the result of step 1434 is no, then in step 1438 the system detects either Cl-35 SD or Cl-37 SD or both.

If the result of step 1438 is yes, then in step 1440 the system decides that the substance is an organophosphorus chloro-G agent or pesticide.

If the result of step 1438 is no, then in step 1442 the system decides that the substance is not an organophosphorus G or V agent.

If in step 1406, the system does not detect P-31 SD, then in step 1410 the system runs the detection of either Cl-35 SD or Cl-37 SD or both.

If the result of step 1410 is no, then in step 1412 the system determines that the substance is not an agent.

If the result of step 1410 is yes, then in step 1420 the system detects either N-14 SD or N-15 SD or it detects both.

If the result of step 1420 is yes, then in step 1424 the system decides that the substance is a nitrogen mustard.

If the results of step 1420 is no, then in step 1422 the system decides that the substance is not a mustard.

If the result of step 1410 is yes, then in step 1414 the system detects S-33 SD.

If the results of step 1414 is no, then in step 1418 the system determines that the substance is not a mustard.

If the result of step 1414 is yes, then in step 1416 the system determines that the substance is an HD sulfur mustard.

Figure 15:
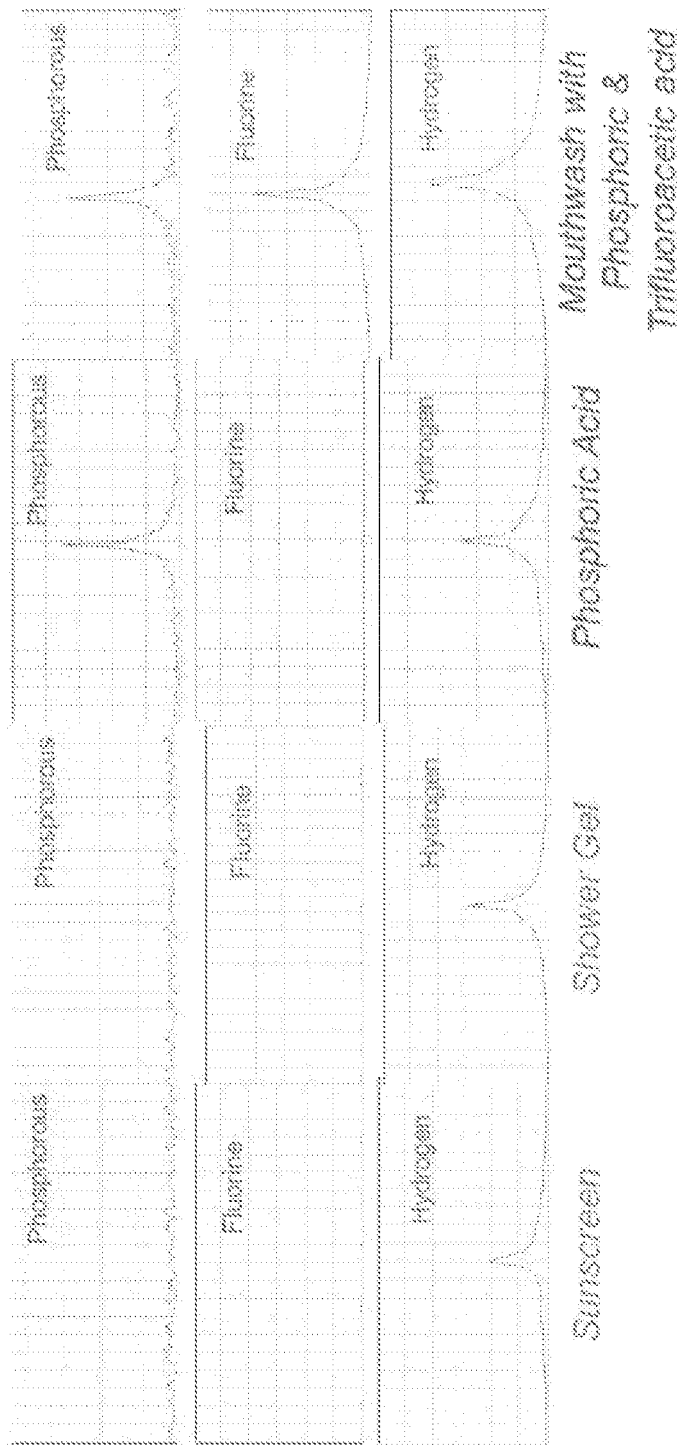
FIG. 15 depicts P-31, F-19, and H-1 NMR signals detected from a variety of samples according to some embodiments.

FIG. 15 depicts P-31, F-19, and H-1 NMR signals detected from a variety of samples according to some embodiments. Sunscreen and shower gel show only an H-1 signal, while 85% phosphoric acid has strong H-1 and P-31 signals. A bottle of mouth wash doped with trifluoracetic acid and phosphoric acid have significant P-31 and F-19 signals.

The first two samples would be classified as benign, while the latter two would be classified as potential threats. While the doped mouthwash has both P-31 and F-19 signals, it may only be classified as a potential threat because the P-31 and F-19 peaks are singlets, rather than doublets split by ~1 kHz, which is the signature of G-agents.

Figure 16:
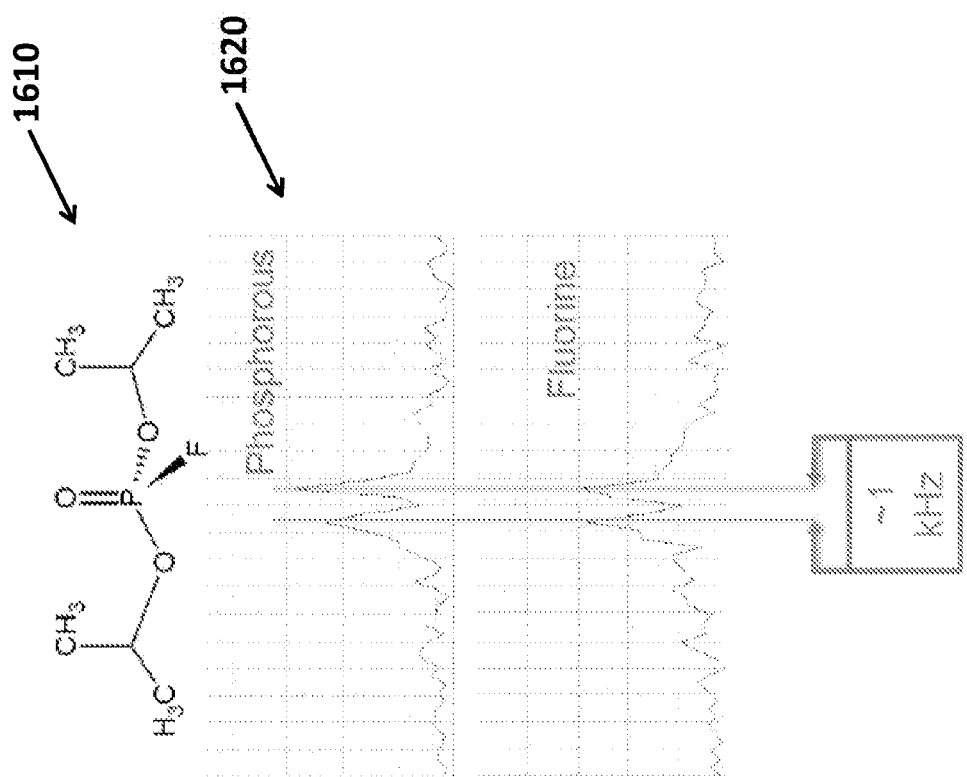
FIG. 16 illustrates a chemical structure for diisopropyl fluorophosphates (DIFP) as measured according to some embodiments.

FIG. 16 illustrates a chemical structure for diisopropyl fluorophosphates (DIFP) 1610 (a chemical nerve agent surrogate) and corresponding phosphorous and fluorine NMR spectra 1620 as measured according to some embodiments. The phosphorous and fluorine spectra are each split by about 1 kHz. This may be a result of J-coupling of the P—F bond. J-coupling results from the magnetic field of adjacent protons influencing the field that a proton experiences.

In some embodiments, various chemical nerve agents containing P—F bonds, such as the G-nerve agents, are expected to contain similar J-coupling in their NMR spectra. NMR spectra including such J-coupling may correspond to a "threat" or other like indicator as described herein.

In some embodiments, nuclear ratios (corresponding to relative spin density amplitudes and the stoichiometry from the molecular compound) may be used to identify chemical nerve agents. This may be used, based at least in part, on chemical nerve agents including P-31, F-19, and H-1 nuclei. This measurement technique may be beneficial because it does not require a standard or knowledge of sample volume.

Some embodiments use a pseudo-empirical formula that connects the phosphorous, fluorine, and hydrogen signal amplitudes—A_P, A_F, and A_H to their spin densities S_P, S_F, and S_H. Then particle formula has the form of equation (2).

$$S\_k = C\_k * A\_k \quad (k=P,F,H) \qquad (2)$$

In equation (2), C_k is an empirically determined calibration factor. The calibration factors C_k are determined by measuring NMR signals (which yields A_k) for P-31, F-19 and H-1 on a reference sample. The reference sample contains P, F and H atoms in one molecule in known amounts, i.e., S_k are known a priori. Using those values, one can determine C_k using equation (3)

$$C\_k = S\_k / A\_k. \qquad (3)$$

Using the above values, the ratio S_H/S_P yields the hydrogen to phosphorous elemental ratio and the ratio S_H/S_F yields the hydrogen to fluorine elemental ratio.

In Some embodiments that use a single coil to detect all nuclei, there may be an exact expression relating the proportionality between S_k to $A\_k \sim f\_k^{1.5} Q\_k^{0.5} * S\_k$, where f_k is the NMR frequency of nucleus k and Q_k is the Q factor of the detection coil at frequency f_k. This can be rewritten thus: $S\_k \sim A\_k / (f\_k^{1.5} * Q\_k^{0.5})$.

Figure 17:
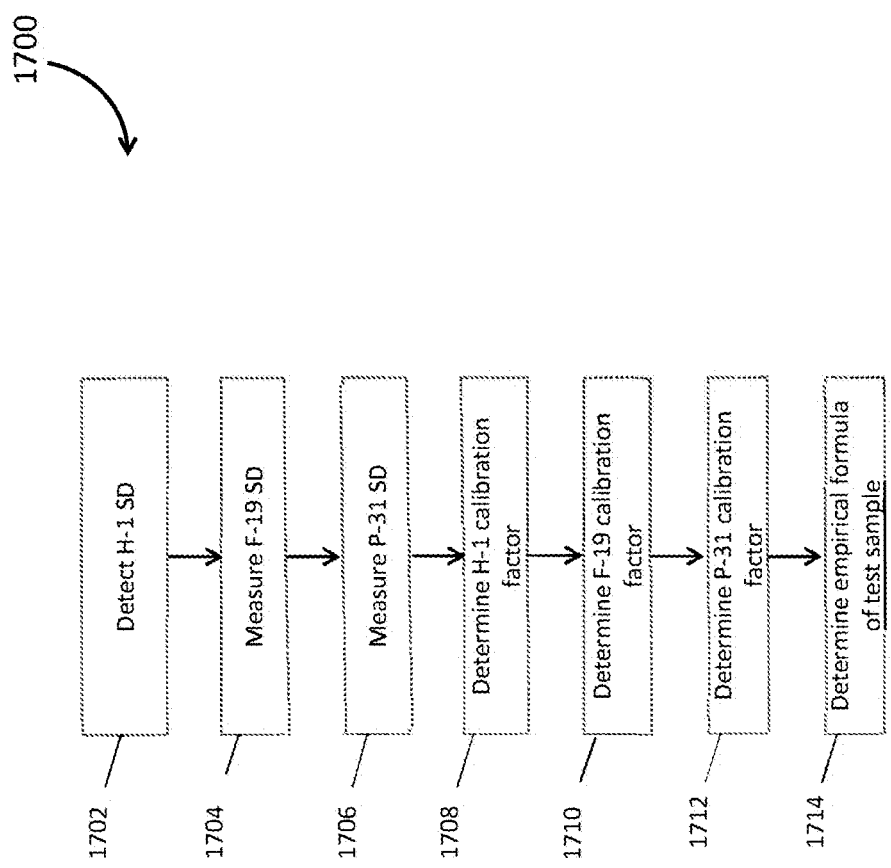
FIG. 17 is a flowchart 1700 for determining the empirical formula for a substance, according to some embodiments.

The NMR console may be used to measure Q, because it can perform the same S11 measurement as a network analyzer. In brief, S11 may be measured by sending an unmodulated, swept frequency signal to the probe input port and observing power reflected from the probe versus frequency. When properly tuned, the reflected power is 0 at the NMR frequency, rising to a maximum, relatively constant value away from the NMR frequency; this constant value is the 0 dB point. The bandwidth of the probe when tuned is calculated from finding the two points where the reflected power is—7 dB (which will be on either side of the location with 0 reflected power)—the distance in frequency between these two points is the bandwidth, and Q is the NMR frequency divided by this bandwidth FIG. 17 is a flowchart 1700 for determining the pseudo-empirical formula for a substance, according to some embodiments.

In step 1702, H-1 SD from a calibration substance such as Di-(2,2,2 trifluoroethyl) methylphosphonate is measured In step 1704, F-19 SD from the calibration sample is measured.

In step 1706, P-31 SD from the calibration sample is measured.

In step 1708, the H-1 calibration factor is calculated to be the total number of hydrogen atoms in the calibration sample divided by H-1 SD.

In step 1710, the F-19 calibration factor is calculated to be the total number of fluorine atoms in the calibration sample divided by F-19 SD.

In step 1712, the P-31 calibration factor is calculated to be the total number of phosphorous atoms in the calibration sample divided by P-31 SD.

In step 1714, the partial empirical formula is determined in the following way: the product of the H-1 SD for the test sample and the H-1 calibration factor divided by the product of the P-31 SD for the test sample and the P-31 calibration factor is the elemental ratio H-1:P-31 for the test sample. The product of the H-1 SD for the test sample and the H-1 calibration factor divided by the product of the F-19 SD and the F-19 calibration factor is the elemental ratio H-1:F-19 for the test sample.

FIG. 18 is a table 1800 demonstrating the use of the flowchart 1700 to determine elemental ratios for a test sample according to one embodiment. The calibration factors are calculated in steps 1708, 1710 and 1712, and are given in this table. The signal amplitudes result from H-1, F-19 and P-31 NMR measurements of the test sample.

For H-1, the spin density of 10000 is the product of the calibration factor (1.00) and the signal amplitude (10000); for F-19 the spin density (747.5) is the product of the calibration factor (1.15) and the signal amplitude (650); for P-31 the spin density (720) is the product of the calibration factor (8) and the signal amplitude (90).

The elemental ratios are determined by dividing the H-1 spin density by the F-19 and P-31 spin densities.

In some embodiments, there is freedom in how the elemental ratios are expressed; in this case the H-1 numerator was set to the lowest whole number that produced approximate whole number values for P-31 and F-19 denominators simultaneously. In table 1800, H:F:P=14:1.0465:1.008.

The foregoing description of the embodiments has been presented for purposes of illustration only. It is not exhaustive and does not limit the embodiments to the precise form disclosed. Those skilled in the art will appreciate from the foregoing description that modifications and variations are possible in light of the above teachings or may be acquired from practicing the embodiments. For example, the described steps need not be performed in the same sequence discussed or with the same degree of separation. Likewise various steps may be omitted, repeated, combined, or performed in parallel, as necessary, to achieve the same or similar objectives. Similarly, the systems described need not necessarily include all parts described in the embodiments, and may also include other parts not described in the embodiments. Accordingly, the embodiments are not limited to the above-described details, but instead are defined by the appended claims in light of their full scope of equivalents.

What is claimed is:

1. A nuclear magnetic resonance (NMR) system configured to detect chemical threat material, comprising:
    a magnet configured to generate a magnetic field of about 300 millitesla or less; and
    a probe configured to:

detect nuclear relaxation of a first nuclei that is selected from a group consisting of $^1$H, $^{19}$F, and $^{31}$P, and further detect nuclear relaxation of a second nuclei that is selected from a group consisting of $^1$H, $^{19}$F, and $^{31}$P, wherein the first selected nuclei is different from the second selected nuclei, detect the spin density of nuclei from the group including $^1$H, $^{19}$F, and $^{31}$P, following excitation.

2. The NMR system of claim 1, wherein:

the probe defines a hollow space capable of receiving a sample; and the probe comprises an electrical shield configured to reduce electrical field inside the hollow space.

3. The NMR system of claim 2, wherein the probe further comprises a detection coil for detecting the nuclear relaxations.

4. The NMR system of claim 3, wherein the electrical shield is configured to reduce an electrical field generated by the detection coil.

5. The NMR system of claim 2, wherein the probe comprises:

a first coil configured to detect relaxation of the first nuclei; and a second coil configure to detect relaxation of a nucleus selected from the group.

6. The NMR system of claim 5, wherein the at least two nuclei are H-1 and F-19.

7. The NMR system of claim 5, wherein the first coil does not require retuning between the detections of the at least two nuclei.

8. The NMR system of claim 1 wherein the chemical threat materials are selected from the group consisting of nerve agents, pesticides, insecticides, and organophosphorus compounds.

9. The NMR system of claim 1, wherein the magnetic field is about 100 millitesla or less.

10. The NMR system of claim 1, further comprising:

a sample receiver configured to receive a container having a width of about 5.4 cm or less.

11. The NMR system of claim 1 wherein the magnet includes a shim to increase magnetic field homogeneity.

12. The NMR system of claim 1 wherein a J-coupling of a heteronuclear bond such as P—F bond is detectable as a multiplet signal split.

13. The NMR system of claim 11 wherein the multiplet signature identifies the chemical threat material as G-Agent.

14. The NMR system of claim 1, wherein the magnet is a permanent magnet.

15. The NMR system of claim 1, wherein the magnet is an electromagnet or a superconducting magnet.

16. The NMR system of claim 15, wherein the NMR system has a volume less than four cubic feet.

17. The NMR system of claim 15, wherein the NMR system has a weight less than 150 lbs.

18. The NMR system of claim 1, wherein the NMR system is portable.

19. The NMR system of claim 1, wherein the group further includes $^{14}$N, and wherein at least three nuclei is selected, and wherein one of the selected nuclei is $^{14}$N.

20. A method comprising:

selecting a first nuclei from a group consisting of $^1$H, $^{19}$F, and $^{31}$P associated with a calibration sample;

selecting a second nuclei from a group consisting of $^1$H, $^{19}$F, and $^{31}$P associated with the calibration sample, wherein the first selected nuclei is different from the second selected nuclei;

measuring a first signal amplitude associated with the first selected nuclei from the calibration sample, wherein the measuring the first signal amplitude is performed using a nuclear magnetic resonance (NMR) system;

measuring a second signal amplitude associated with the second selected nuclei from the calibration sample, wherein the measuring the second signal amplitude is performed using the NMR system;

determining a number of atoms for the first nuclei in the calibration sample;

determining a number of atom for the second nuclei in the calibration sample;

determining a first calibration factor based on the first signal amplitude and the number of atoms for the first nuclei in the calibration sample;

determining a second calibration factor based on the second signal amplitude and the number of atom for the second nuclei in the calibration sample; and deriving a pseudo empirical formula for a molecule based on the first signal amplitude, the second signal amplitude, the first calibration factor, and the second calibrator factor.

* * * * *